United States Patent [19]
Rolfson

[11] Patent Number: 5,225,035
[45] Date of Patent: Jul. 6, 1993

[54] METHOD OF FABRICATING A PHASE-SHIFTING PHOTOLITHOGRAPHIC MASK RETICLE HAVING IDENTICAL LIGHT TRANSMITTANCE IN ALL TRANSPARENT REGIONS

[75] Inventor: J. Brett Rolfson, Boise, Id.

[73] Assignee: Micron Technology, Inc., Boise, Id.

[21] Appl. No.: 898,873

[22] Filed: Jun. 15, 1992

[51] Int. Cl.$^5$ ............... B44C 1/22; C03C 15/00; C03C 25/06; C23F 1/00
[52] U.S. Cl. ................ 156/643; 156/651; 156/655; 156/656; 156/659.1; 156/661.1; 156/663; 430/5; 430/321; 430/323
[58] Field of Search ........... 156/643, 651, 655, 656, 156/659.1, 661.1, 663, 664; 430/5, 321, 323, 329; 359/566, 569, 573

[56] References Cited

U.S. PATENT DOCUMENTS

| | | | |
|---|---|---|---|
| 4,530,736 | 7/1985 | Mutter | 156/643 |
| 4,988,404 | 1/1991 | Aoyagi | 156/651 |
| 5,024,726 | 6/1991 | Fujiwara | 156/653 |

OTHER PUBLICATIONS

Yamanaka, et al., "A 5.9 Micrometer$^2$ Super Low Power SRAM Cell Using a New Phase-Shifting Lithography" IEDM 90 (Apr., 1990) p. 477.
Watanabe, et al., "Transparent Phase Shifting Mask", IEDM 90 (Apr., 1990), p. 821.
Nitayama, et al., "New Phase Shifting Mask with Self-aligned Phase Shifters for a Quarter Micron Photolithograph", IEDM 89 (Jul., 1989), p. 57.
Lin, Burn J., "Phase Shifting and Other Challenges in Optical Mask Technology", IBM-EF-15 (Sep. 26, 1990).
Jinbo, et al., "0.2 μm or Less i-Line lithography by Phase-Shifting-Mask Technology", IEDM 90 (Apr., 1990), p. 825.

*Primary Examiner*—William A. Powell
*Attorney, Agent, or Firm*—Angus C. Fox, III

[57] ABSTRACT

This invention constitutes a method of fabricating a phase-shifting photolithographic mask reticle having identical light transmittance characteristic in all transparent regions. The method is applicable to those types of phase-shifting reticles that are fabricated by masking alternating transparent regions with photoresist and subjecting the exposed transparent regions to a plasma etch until the thicknesses of the transparent reticle material has been relieved to a degree sufficient to effect diffraction cancellation between neighboring transparent regions. This invention solves the problem of unequal transmittance characteristics of plasma etched transparent regions and unetched transparent regions by subjecting the reticle to a second plasma etch once the photoresist has been removed. Thus, both the transparent regions that were initially etched and the transparent regions that were initially unetched are subjected to an etch. Both types of regions are relieved further, thus maintaining the phase-shifted relationship between the two types of transparent regions, and also equalizing the transmittance characteristics of both types of transparent regions.

9 Claims, 1 Drawing Sheet

5,225,035

METHOD OF FABRICATING A PHASE-SHIFTING PHOTOLITHOGRAPHIC MASK RETICLE HAVING IDENTICAL LIGHT TRANSMITTANCE IN ALL TRANSPARENT REGIONS

FIELD OF THE INVENTION

This invention relates to semiconductor manufacture and, more particularly, to a novel process particularly suited to fabricating phase shifting mask reticles that have identical light transmisivity in all transparent regions.

BACKGROUND OF THE INVENTION

As semiconductor manufacturing advances to ultra-large scale integration (ULSI), the devices on semiconductor wafers must be shrunk to sub-micron dimensions and the circuit density must be increased to several million transistors per die. In order to accomplish this high device packing density, smaller and smaller feature sizes are required. This may include the width and spaces between device interconnect lines and the surface geometry such as contact openings and the like.

The requirement of small feature sizes with close spacing between adjacent features requires high resolution photolithographic processes. In general, photolithography utilizes a beam of light, such as ultraviolet (UV) radiation, to transfer a pattern from a photolithographic reticle pattern onto a photoresist coating through an imaging lens. Reticles are generally made of laminar transparent quartz. The reticle pattern includes opaque regions (i.e., regions having a thin layer of chromium plating), as well as transparent regions. Were it not for the diffraction phenomenon, and were all light rays passing through the reticle parallel to one another, the pattern on the reticle would be transmitted exactly to the photoresist coating. However, when the dimensions of the opaque and transparent reticle regions are near the wavelength of the light utilized to project the image, diffraction becomes a significant problem. Regions on the photoresist that should be dark are illuminated with diffracted light rays.

One technique currently being investigated for mitigating the diffraction effect, so as to improve the resolution of the photolithograhic process, is known as phase shift lithography. In phase shift lithography, diffracted light rays from adjacent transparent regions of the reticle are made to cancel one another, thus eliminating the diffraction effect and improving the resolution and depth of optical images projected onto a target. The cancellation of diffracted rays from adjacent transparent regions is effected by adjusting the light path through the various transparent reticles such that light passing through any transparent region is 180 degrees out of phase with the light passing through any adjacent transparent region. Thus, when light rays are diffracted from two neighboring transparent regions of the reticle, they cancel one another when they coincide at some point below the intervening opaque region. The mathematics employed in the construction of a phase-shifting reticle are well known in the art, and will not be discussed herein.

One of the most common and successful techniques for fabricating a phase-shifting reticle is to take a conventional reticle consisting of a uniformly thick quartz layer on which a chromium layer has been patterned to produce a patten of opaque and transparent regions, mask every other transparent region with photoresist, and then subject the photoresist masked reticle to a plasma etch until the unmasked transparent regions are relieved to an extent that, when the photoresist mask is removed, rays of light from the coherent source used for the photolithographic exposure process will pass through the unetched transparent regions and exit the reticle one-half wavelength behind rays of light from the same coherent source that pass through neighboring etched transparent regions. Although such a process works acceptably in principle, the plasma etch damages the optical characteristics of the quartz so that transmittance through the etched transparent regions is reduced as compared to the transmittance through unetched transparent regions. The result is somewhat less than adequate cancellation of the neighboring diffraction patterns.

SUMMARY OF THE INVENTION

This invention solves the problem of unequal transmittance characteristics of plasma etched transparent regions and unetched transparent regions in a phase-shifting reticle fabricated by the aforedescribed process. This is accomplished by subjecting the reticle to a second plasma etch once the photoresist has been removed. Thus, both the transparent regions that were initially etched and the transparent regions that were initially unetched are subjected to an etch. Both types of regions are relieved further, thus maintaining the phase-shifted relationship between the two types of transparent regions, and also equalizing the transmittance characteristics of both types of transparent regions.

PREFERRED EMBODIMENT OF THE INVENTION

Figure 1:
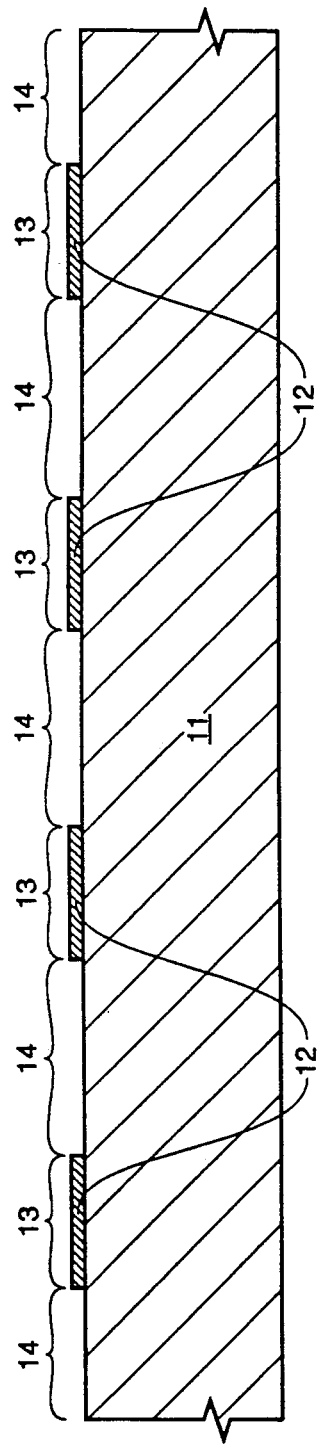
FIG. 1 is a cross-sectional view of a portion of a conventional photolithographic mask reticle.

Referring now to FIG. 1, a portion of a conventional photolithographic mask reticle is depicted in cross-sectional format. The reticle consists of a uniformly thick quartz plate 11 and a thin, chromium metal layer 12, which has been selectively etched so as to create a pattern of opaque regions 13 and transparent regions 14.

Figure 2:
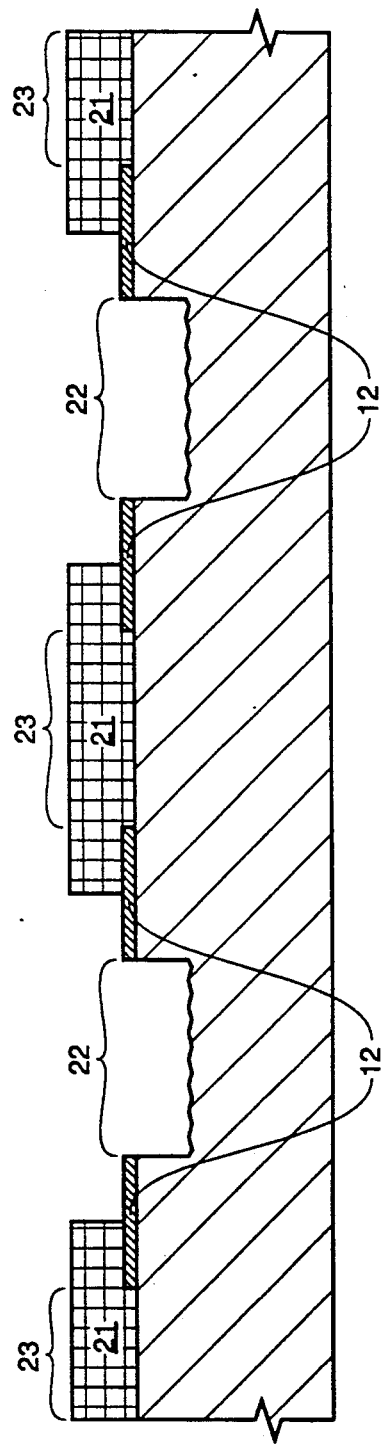
FIG. 2 is a cross-sectional view of a portion of a phase-shifting reticle fabricated by a process well known in the art.

Referring now to FIG. 2, the conventional mask reticle of FIG. 1 may converted to a phase-shifting reticle by masking every other transparent region with photoresist 21, and then subjecting the photoresist masked reticle to a highly anisotropic plasma etch (an etch which etches in primarily one direction) until the unmasked transparent regions 22 are relieved to a depth such that, when the photoresist mask is removed, rays of light from the coherent source used for the photolithographic exposure process will pass through the unetched transparent regions 23 and exit the reticle one-half wavelength behind rays of light from the same coherent source that pass through neighboring etched transparent regions. Although such a process works acceptably in principle, the plasma etch damages the optical characteristics of the quartz so that transmittance through the etched transparent regions 22 is reduced as compared to the transmittance through unetched transparent regions 23. The result is somewhat less than adequate cancellation of the neighboring diffraction patterns on the surface which is to be exposed by the reticle.

Figure 3:
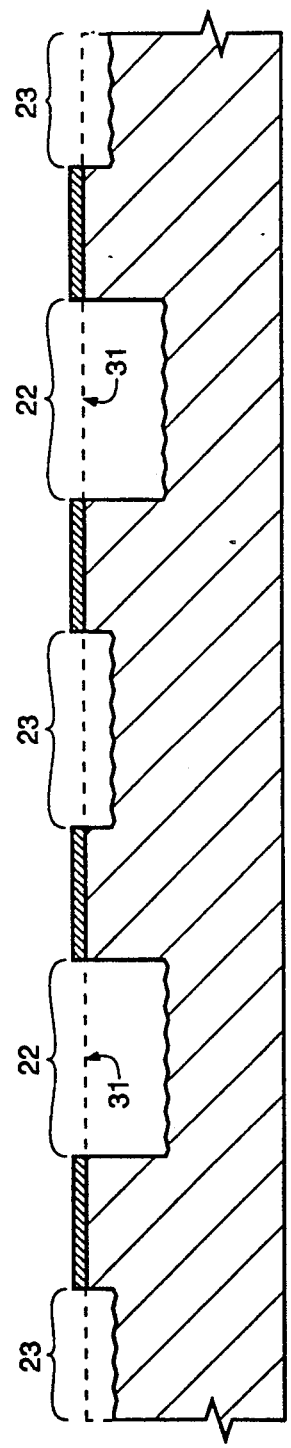
FIG. 3 is a cross-sectional view of a portion of the phase-shifting reticle of FIG. 1, following further processing to create a phase-shifting reticle having identical transmittance characteristics in all transparent regions.

Referring now to FIG. 3, the phase-shifting reticle of FIG. 2 has been stripped of photoresist, and subjected to a second highly anisotropic plasma etch. Thus, both the transparent regions that were initially etched 22 and the transparent regions that were initially unetched 23 are subjected to an etch. Both types of transparent regions are relieved below the original upper surface level 31 of the quartz plate 11. However, the relative levels of the two types of transparent regions is maintained during the second plasma etch, thus preserving the phase-shifting relationship of the two types of transparent regions. The second plasma etch provides the advantage of equalizing the transmittance characteristics of both types of transparent regions.

Although only a single embodiment of the invention has been disclosed herein, it will be obvious to those having ordinary skill in the art of photolithographic reticle manufacture, that changes and modifications may be made thereto without departing from the spirit and the scope of the invention as hereinafter claimed.

I claim:

1. A method of fabricating a phase-shifting photolithographic mask reticle having identical light transmission characteristics in all transparent regions, said method comprising the following sequence of steps:
    (a) depositing a opaque metal layer on a quartz plate;
    (b) removing portions of the opaque metal layer to produce a reticle pattern of opaque portions and transparent portions;
    (c) masking alternating transparent portions of the reticle pattern;
    (d) subjecting the reticle to a first plasma etch so as to relieve the unmasked transparent portions of the reticle pattern to a depth such that, when the reticle pattern is unmasked, rays of light from a source of coherent light having a wavelength that is desired for subsequent exposure applications will pass through the unetched transparent regions and exit the reticle one-half wavelength behind rays of light from the same coherent source that pass through neighboring etched transparent regions;
    (e) unmasking the reticle pattern; and
    (f) subjecting the reticle pattern to a second plasma etch so as to equalize the optical properties of the transparent portions that were not etched during the first plasma etch and of the transparent portions that were etched during the first plasma etch.

2. The method of claim 1, wherein said first plasma etch and said second plasma etches are both highly anisotropic.

3. The method of claim 1, wherein said metal layer comprises chromium.

4. The method of claim 1, wherein masking is performed with photoresist.

5. A method for equalizing the transmission characteristics in all transparent regions of a photolithographic mask reticle of the type fabricated from a uniformly thick quartz layer on which a chromium layer has been patterned to produce a patten of opaque and transparent regions, every other transparent region of said reticle having been masked with photoresist, following which said reticle is subjected to a first plasma etch until the unmasked transparent regions are relieved to a depth such that when the photoresist is stripped, rays of light from a source of coherent light having a wavelength that is desired for subsequent exposure applications will pass through the unetched transparent regions and exit the reticle one-half wavelength behind rays of light from the same coherent source that pass through neighboring etched transparent regions, wherein said method comprises the step of subjecting the reticle pattern to a second plasma etch following removal of the photoresist so as to equalize the optical properties of the transparent portions that were not etched during the first plasma etch and of the transparent portions that were etched during the first plasma etch.

6. A method of fabricating a phase-shifting photolithographic mask reticle having identical light transmission characteristics in all transparent regions, said method comprising the following sequence of steps:
    (a) depositing a opaque metal layer on a quartz plate;
    (b) removing portions of the opaque metal layer to produce a reticle pattern of opaque portions and transparent portions;
    (c) masking alternating transparent portions of the reticle pattern;
    (d) subjecting the reticle to a first plasma etch;
    (e) unmasking the reticle pattern; and
    (f) subjecting the reticle pattern to a second plasma etch.

7. The method of claim 6, wherein said masking is performed with photoresist.

8. The method of claim 7, wherein said metal comprises chromium.

9. The method of claim 8, wherein said first and second plasma etches are highly anisotropic.

* * * * *